United States Patent [19]

Nadaoka

[11] Patent Number: 5,329,162
[45] Date of Patent: Jul. 12, 1994

[54] SEMICONDUCTOR DEVICE HAVING A CONDUCTOR LAYER PROVIDED OVER A SEMICONDUCTOR SUBSTRATE

[75] Inventor: Mitsuru Nadaoka, Tokyo, Japan
[73] Assignee: Oki Electric Industry Co., Ltd., Tokyo, Japan
[21] Appl. No.: 899,853
[22] Filed: Jun. 17, 1992
[30] Foreign Application Priority Data
  Jun. 21, 1991 [JP] Japan .................. 3-150485
[51] Int. Cl.$^5$ .................. H01L 23/48; H01L 29/44; H01L 29/52; H01L 29/60
[52] U.S. Cl. .................. 257/774; 257/739; 257/773; 257/775; 257/776; 257/786
[58] Field of Search .............. 257/739, 773, 774, 775, 257/776, 786

[56] References Cited

U.S. PATENT DOCUMENTS 4,625,227  11/1986  Hara et al. .................. 357/68
5,055,907  10/1991  Jacobs .................. 357/71

FOREIGN PATENT DOCUMENTS 45259    3/1982  Japan .
174948   7/1987  Japan .
46981    9/1988  Japan .

Primary Examiner—Sara W. Crane
Assistant Examiner—Valencia M. Wallace
Attorney, Agent, or Firm—Spencer, Frank & Schneider

[57] ABSTRACT

A semiconductor device has a semiconductor substrate and a conductor layer provided over the semiconductor substrate. The conductor layer includes a first linear part extending in a first direction and provided with slits extending in the first direction, a second linear part extending in a second direction at an angle with the first direction and provided with slits extending in the second direction, and a junction part formed where the first and second linear parts are connected and provided with slits shorter than the slits in the first and second linear parts.

8 Claims, 7 Drawing Sheets

SEMICONDUCTOR DEVICE HAVING A CONDUCTOR LAYER PROVIDED OVER A SEMICONDUCTOR SUBSTRATE

BACKGROUND OF THE INVENTION

1. Field of the Invention

The present invention relates to a semiconductor device having a semiconductor substrate and a conductor layer formed thereon, and a method for making such a semiconductor device.

2. Background Information

A prior-art semiconductor device, shown in Japanese Patent Kokai Publication No. 174948/1987, uses a conductor layer of which a wide part in the periphery of the chip is provided with slits in order to prevent or reduce sliding or disconnection due to an internal stress of plastic packaging or a thermal stress during thermal cycle tests.

The slits are normally provided to extend in the direction in which the conductor extends. At a junction 20 where two conductor parts are connected or branched as shown in FIG. 11, the directions of the slits 21 in the respective conductor parts are made parallel with the edges of the conductor parts in which the slits are provided. A problem associated with the pattern off slits shown in FIG. 11 is that electric currents concentrate in the hatched area 22, and electromigration tends to occur. This degrades the reliability of the conductor layer.

Moreover, in the past, the insertion or disposition of the slits was made manually, in accordance with slit introduction standards determined for each LSI vendor, so the designing of the slit insertion was time-consuming. Furthermore, there is an increasing demand for the layout to be performed by LSI developers rather than LSI vendors. But as the LSI developers have little experience with layout designing, it is very difficult for them to carry out the slit insertion designing using a layout editor.

It is therefore desirable to be able to provide automatic insertion of slits in the conductor patterns.

Another prior-art publication, Japanese Patent Kokoku Publication No. 46981/1988 shows a method of disposition of slits at a corner of a conductor pattern. But it does not teach methods or rules of deposition which can be applied to various types of junction parts.

SUMMARY OF THE INVENTION

An object of the invention is to provide a conductor which avoids concentration of electric currents and is highly reliable.

Another object of the invention :Is to provide automatic insertion of slits in the conductor pattern, to thereby enable those (such as LSI developers) having little experience with the layout designing to insert slits satisfying the slit introduction standards determined by the respective LSI vendors.

A semiconductor device according to one aspect of the invention has a semiconductor substrate and a conductor layer provided over the semiconductor substrate;

wherein said conductor layer comprises a first linear part extending in a first direction and provided with slits extending in said first direction, a second linear part extending in a second direction at an angle with said first direction and provided with slits extending in said second direction, and a junction part formed where said first and second linear parts are connected and provided with slits shorter than the slits in said first and second linear parts.

A semiconductor device according to another aspect of the invention has a semiconductor substrate and a conductor layer provided over the semiconductor substrate;

wherein said conductor layer comprises a first linear part extending in a first direction and provided with slits extending in said first direction, a second linear part extending in a second direction at a angle with said -first direction and provided with slits extending in said second direction, a third linear part extending in said second direction and provided with slits extending in said second direction, a first junction part formed where said first and second linear parts are connected, and a second junction part formed where said first and third linear parts are connected, said first and second junction parts overlapping each other to form an aggregate, third junction part, said third junction part being provided with slits shorter than the slits in said first and second linear parts.

The directions of the slits are determined taking account of the direction of electric currents in the junction parts, so that concentration of electric currents is avoided. Rules have been established for determining the directions of the slits, so that an automatic insertion of the slits is possible.

DETAILED DESCRIPTION OF THE PREFERRED EMBODIMENTS

Division of the various types of junction parts into triangular regions and insertion of slits in the respective triangular regions will first be described with reference to FIG. 1A to FIG. 1D.

EMBODIMENT OF FIG. 1A

Figure 1A:
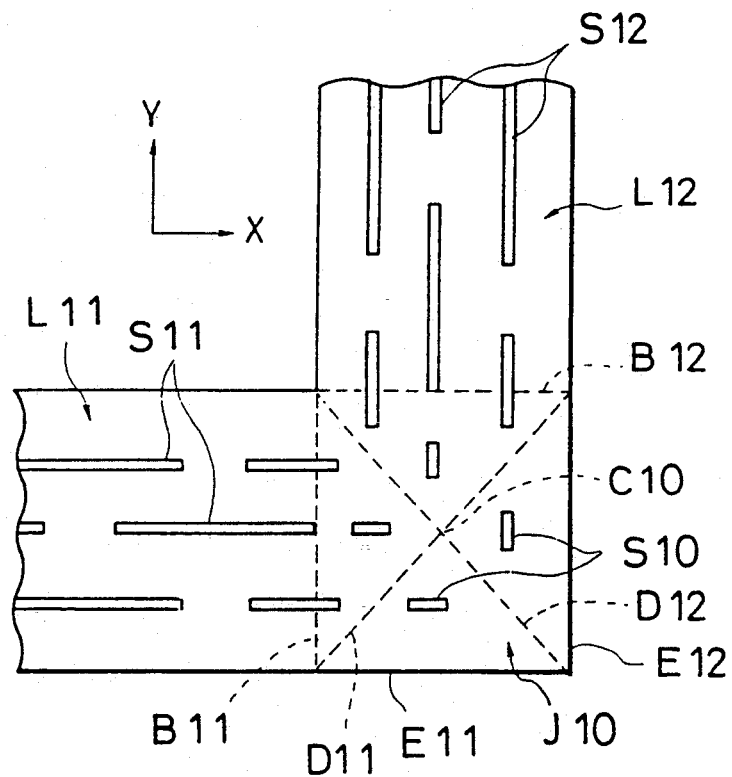
FIG. 1A to FIG. 1D are patterned diagrams showing division of the junction parts into triangular regions and insertion of the slits in the junction parts in various embodiments of the invention.

FIG. 1A is a diagram showing a conductor pattern formed over a semiconductor substrate SS in a semiconductor device in an embodiment of the invention. As illustrated, the conductor layer 30 comprises a first linear part L11, a second linear part L12, and a junction part J10 formed where the first and second linear parts L11 and L12 are connected. The first and second linear parts L11 and L12 are straight, each have a constant width, and are at an angle, typically a right angle, with each other. The direction in which the first linear part L11 extends, i.e., the horizontal direction in the drawings, is referred to as the X direction, and the direction in which the second linear part L12 extends, i.e.., the vertical direction in the drawings, is referred to as the Y direction. The junction part J10 is defined as a rectangular part which forms an extension of the first linear part L11 and also forms an extension of the second linear part L12.

The first and second linear parts L11 and L12 are provided with slits S11 and S12, which extend in the direction in which the respective linear parts L11 and L12 extend. The slits S11 and S12 are intermittent, as illustrated.

The junction part J10 is also provided with slits S10 which are intermittent, as illustrated, and shorter than the slits in linear parts L11 and L12. In the illustrated embodiment, some of the slits S10 extend in the X direction, and the rest of the slits S10 extend in the Y direction.

The slits in the junction part J10 may be continuous with the slits in the linear parts L11 and L12, as are some of the illustrated slits.

The directions of the silts in the junction part J10 are determined according to the following rules.

That is, the slits in a first triangular region whose vertexes are ends of a first boundary line B11 between the first linear part L11 and the junction part J10, and the center C10 of the junction part J10 (i.e., a triangular region whose sides are the first boundary line B11, and lines connecting the center C10 of the junction part J10 and ends of the first boundary line B11) extend in the direction (X direction) in which the First linear part L11 extends.

Here, the center (C10) of the junction part (J10) is the intersection of two diagonal lines (D11 and D12) of the junction part which is rectangular.

The slits in a second triangular region whose vertexes are ends of a second boundary line B12 between the second linear part L12 and the junction part J10, and the center C10 of the junction part J10 extend in the direction (Y direction) in which the second linear part L12 extends.

Moreover, the junction part J10 has a first edge E11 forming an extension of an edge of the first linear part L11, and the slits in a third triangular region whose vertexes are ends of the edge E11 and the center C10 of the junction part J10 extend in the direction parallel with the edge E11.

Here the term "edge" means a boundary line between the conductor pattern and the area outside the conductor pattern.

Furthermore, the junction part J10 has a second edge E12 forming an extension of all edge of the second linear part L12, and the slits in a fourth triangular region whose vertexes are ends of the edge E12 and the center C10 of the junction part J10 extend in the direction parallel with the edge E12.

EMBODIMENT OF FIG. 1B

Figure 1B:
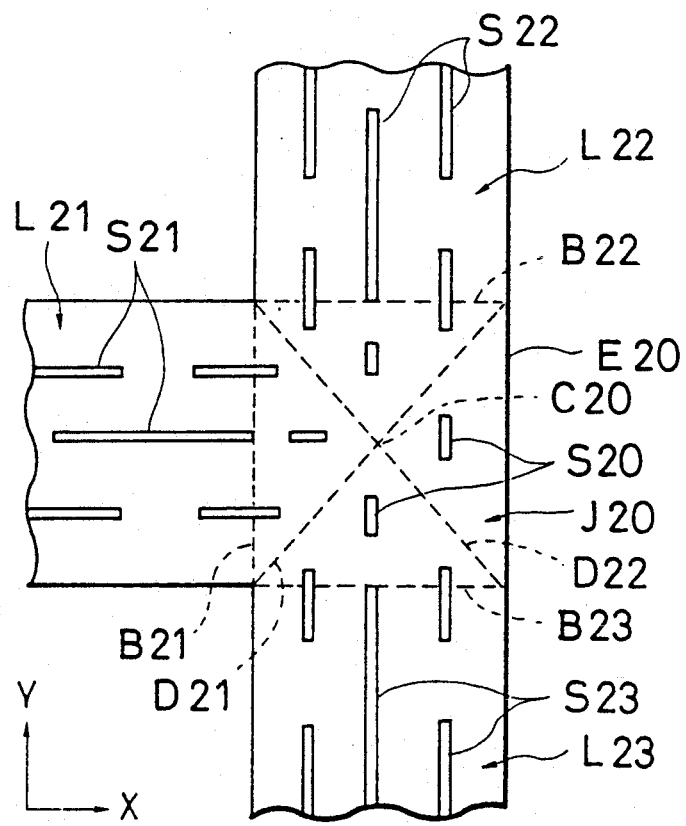

FIG. 1B shows a conductor pattern in another embodiment of the invention. As illustrated, the conductor layer 30 comprises a first linear part L21, a second linear part part L22, a third linear part part L23, and a junction part J20 formed where the first, second and third linear parts L21, L22 and L23 ace connected. The linear parts are straight, each have a constant width. The first linear part L21 extend in a first or X direction. The second and third linear parts L22 and L23 extend in a second or Y direction. The junction part J20 is defined as a rectangular part which forms an extension of the first linear part L21, an extension of the second linear part L22, and an extension of the third linear part L23.

The first, second and third linear parts L21, L22 and L23 are provided with slits S21, S22 and S23, which extend in the direction in which the respective linear parts extend. The slits S21, S22 and S23 are intermittent, as illustrated.

The junction part J20 is also provided with slits S20 which are intermittent, as illustrated, and shorter than the slits in the linear parts L21, L22 and L23.

The slits in the junction part J20 may be continuous with the slits in the linear parts L21, L22 and L23, as are some of the illustrated slits.

The directions of the slits in the junction part J20 are determined according to the following rules.

That is, the slits in a-First triangular region whose vertexes are ends of a First boundary line B21 between the first linear part L21 and the junction part J20, and the center C20 of the junction part J20 extend in the direction (X direction) in which the first linear part L21 extends.

Here, the center (C20) of the junction part (J20) is the intersection of two diagonal lines (I)21 and D22) of the junction part which is rectangular.

The slits in a second triangular region whose vertexes are ends of a second boundary line B22 between the second linear part L22 and the function part J20, and the center C20 of the junction part J20 extend in the direction (Y direction) in which the second linear part L22 extends. Similarly, the slits in a third triangular region whose vertexes are ends of a third boundary line B23 between the third linear part L23 and the junction part J20, and the center C20 of the junction part J20 extend in the direction (Y direction) in which the third linear part L23 extends.

Moreover, the junction part J20 has an edge E20 forming an extension of an edge of the second linear part L22 and also forming an extension of an edge of the third linear part L23, and the slits in a fourth triangular region whose vertexes are ends of the edge E20 and the center C20 of the second junction part J20 extend in the direction parallel with the edge E22.

EMBODIMENT OF FIG. 1C

Figure 1C:
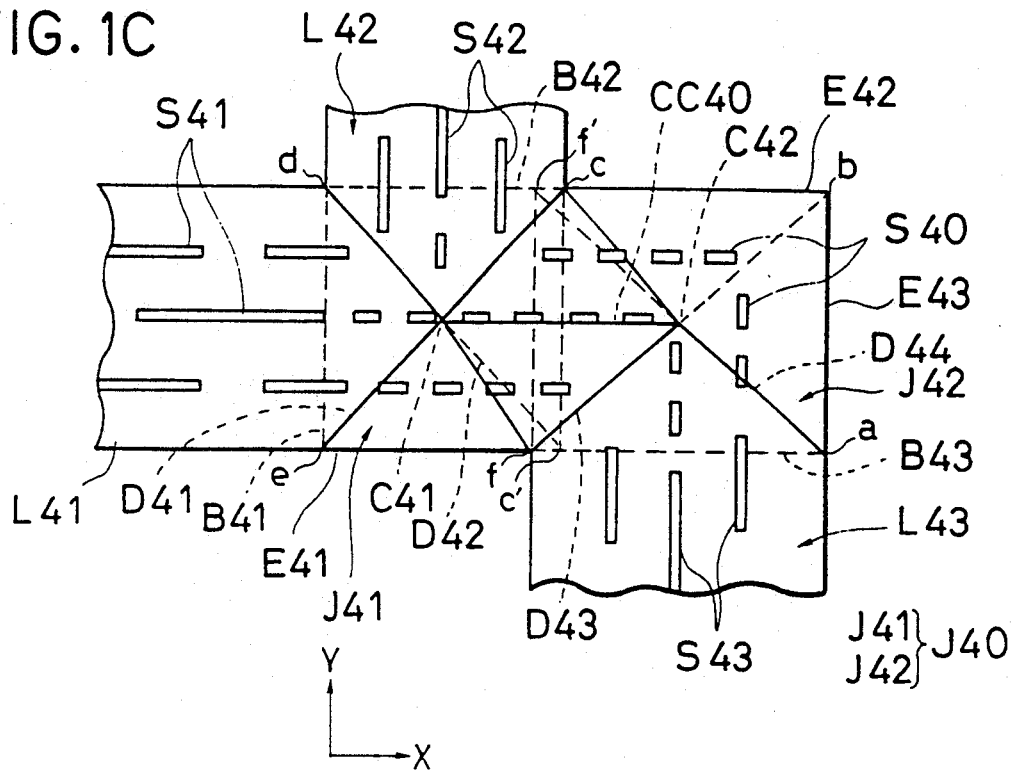
Figure 1D:
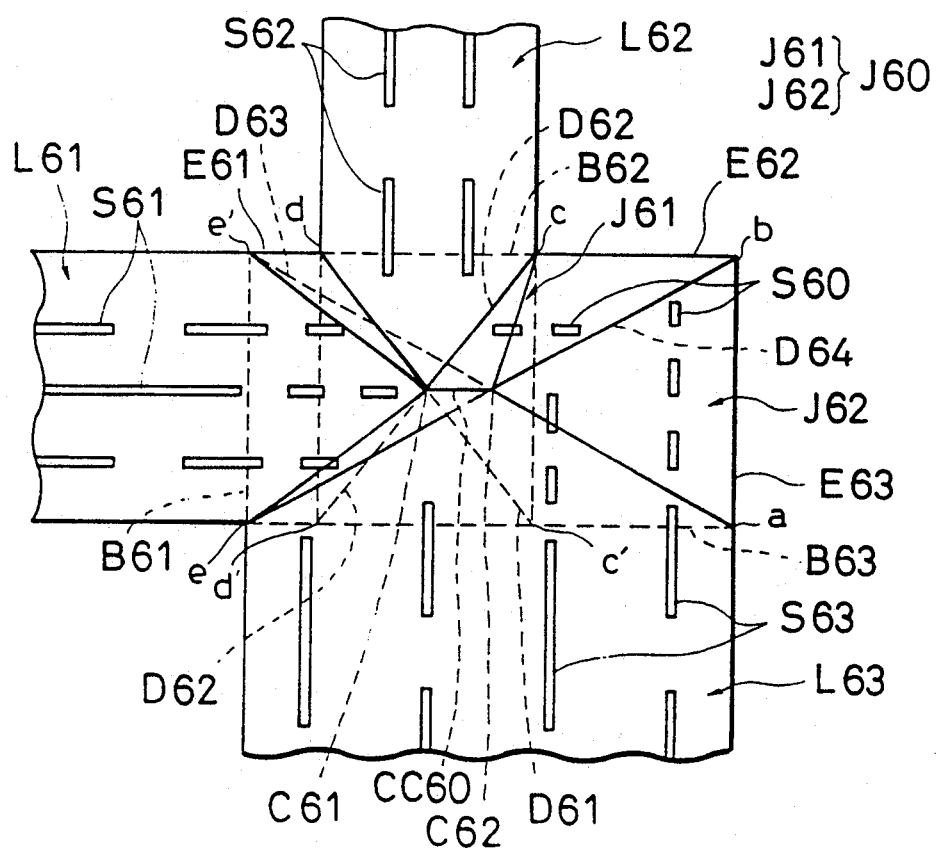

FIG. 1C shows a conductor pattern in another embodiment of the invention. As illustrated, the conductor layer 40 comprises a first linear part L41, a second linear part part L42, and a third linear part part L43, and a junction part J40 formed where the first, second and third linear parts L41, L42 and L43 are connected. The linear parts are straight, and each have a constant width. The first linear part L41 extends in a first or X direction. The second and third linear parts L42 and L43 extend in a second or Y direction. The junction part J40 is an aggregate of a first junction part J41 which is a rectangular part (dec'c) forming an extension of the first linear part L41, and also forming an extension of the second linear part L42, and a second junction part J42 which is a rectangular part (f'fab) forming an extension of the first linear part L41 and also forming an extension of the third linear part L43.

The term "aggregate" has the following meaning: If an area is part of at least one of the first and second junction parts, then that area is part of the aggregate junction part. Thus, the junction part J40 is a rectangular part whose vertexes are at d, e, a and b.

The first, second and third linear parts L41, L42 and L43 are provided with slits S41, S42 and S43 which extend in the direction in which the respective linear parts extend. The slits S41, S42 and S43 are intermittent, as illustrated.

The junction part J40 is also provided with slits S40 which are intermittent, as illustrated, and shorter than the slits in the linear parts L41, L42 and L43.

The slits in the junction part J40 may be continuous with the slits in the linear parts L41, L42 and L43, as are some of the illustrated slits.

The directions of the slits in the junction part J40 are determined according to the following rules. It should be noted that in FIG. 1C, lines forming sidles of triangular regions are indicated by solid lines, to better distinguish them from dotted lines indicating diagonal lines not used as the sides of the triangular regions).

That is, the slits in a first triangular region (C41-d-e) whose vertexes are ends (d, e) of a first boundary line B41 between the first linear part L41 and the aggregate junction part J40, and the center C41 of the first junction part J41 extend in the direction (X direction) in which the first linear part L41 extends.

Here, the centers (C41 and C42) of the junction parts (J41 and J42) are the intersections of two diagonal lines (D41 and D42; and D43 and D44) of the junction parts (J41 and J42) which are rectangular.

It should be noted that the one of the centers (C41) of the respective junction parts J41 and J42 which is closer to the boundary line B41 is used as one of the vertexes of the triangular region.

The slits in a second triangular region (C41-c-d) whose vertexes are ends (c, d) of a second boundary line B42 between the second linear part L42 and the aggregate junction part J40, and the center C41 of the first junction part J41 extend in the direction (Y direction) in which the second linear part L42 extends. Similarly, the slits in a third triangular region (C42-f-a) whose vertexes are ends (f, a) of a third boundary line B43 between the third linear part L43 and the aggregate junction part J40, and the center C42 of the second junction part J42 extend in the direction (Y direction) in which the third linear part L43 extend.

Moreover, the first junction part J41 has an edge E41 forming an extension of art edge (lower edge as seen in the figure) of the first linear part L41, and the slits in a fourth triangular region (C41-e-f) whose vertexes are ends (e, f) of the edge E41 and the center C41 of the first junction part J41 extend in the direction parallel with the edge E41.

Similarly, the second junction part J42 has a first edge E42 forming an extension of an edge (upper edge as seen in the figure) of the first linear part L41, and the slits in a fifth triangular region (C42-b-c) whose vertexes are ends (b, c) of the edge E42 and the center C42 of the second junction part J42 extend in the direction parallel with the edge E42. It should be noted that the one of the centers C41, C42 of the respective junction parts J41 and J42 which is closer to the respective edge E41, E42 is used as one of the vertexes of the respective triangular region.

Similarly, the second junction part J42 has a second edge E43 forming an extension of an edge (right edge as seen in the figure) of the third linear part L43, and the slits in a sixth triangular region (C42-a-b) whose vertexes are ends (a, b) of the edge E43 and the center C42 of the second junction part J42 extend in the direction parallel with the edge E43 of the second junction part J42.

Furthermore, the slits in a seventh triangular region (C41-C42-c) whose vertexes are the centers C41 and C42 of the first and second junction parts J41 and J42, and a corner point (c) which is all end of an edge of the second linear part L42 and which is also an end of the edge E42 of the junction part J40 extend in the direction parallel with a center-to-center line CC40 connecting the centers C41 and C42.

Similarly, the slits in an eighth triangular region (C42-C41-f) whose vertexes are the centers C41 and C42 and a corner point (f) which is an end of the edge the third linear part L43 and which is also an end of the edge E41 of the junction part J40 extend in the direction parallel with the center-to-center line CC40.

EMBODIMENT OF FIG. 1D

Figure 11:
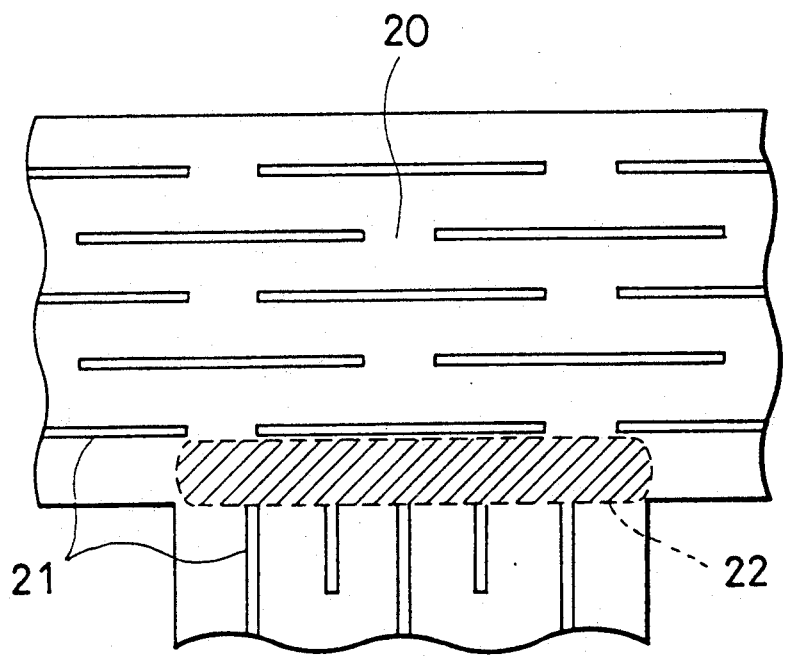
FIG. 11 is a pattern diagram showing the conductor layer in the prior art.

FIG. 11 shows a conductor pattern in another embodiment of the invention. As illustrated, the conductor layer 60 comprises a first linear part L61, a second linear part part L62, a third linear part part L63, and a junction part J60 formed where the first, second and third linear parts L61, L62 and L63 are connected. The linear parts are straight, each have a constant width. The first linear part L61 extends in a first or X direction. The second and third linear parts L62 and L63 extend in a second or Y direction. The third linear part L63 is wider than the first and second linear parts L61 and L62. The junction part J60 is an aggregate of a first junction part J61. (rectangular region dd'c'c) forming an extension of the first linear part L61, and also forming an extension of the second linear part L62, and a second junction part J62 (rectangular region e'eab) forming an extension of the first linear part L61 and also forming an extension of the third linear part L63. In the illustrated example, the first junction part J61 is entirely contained in the second junction part J62, so the aggregate junction part J60 is identical with the second junction part J62.

The first, second and third linear parts L61, L62 and L63 are provided with slits S61, S62 and S63, which extend in the direction in which the respective linear pares extend. The slits S61, S62 and S63 are intermittent, as illustrated.

The junction part J60 is also provided with slits S60 which are intermittent, as illustrated, and shorter than the slits in the linear parts L61, L62 and L63.

The slits in the junction part J60 may be continuous with the slits in the linear parts L61, L62 and L63, as are some of the illustrated slits.

The directions of the slits in the junction park J60 are determined according to the following rules. It should be noted that in FIG. 1D, lines forming sides of triangular regions are indicated by solid lines, to better distinguish them from dotted lines indicating diagonal lines not used as the sides of the triangular regions).

That is, the slits in a first triangular region (C61-e'-e) whose vertexes are ends (e', e) of a first boundary line B61 between the first linear part L61 and the aggregate junction pact J60, and the center C61 of the first junction part J61 extend in the direction (X direction) in which the first linear part L61 extends.

Here, the centers (C61 and C62) off the junction parts (J61 and J62) are the intersections of two diagonal lines (D61 and D62; and D63 and D64) of the junction parts (J61 and J62) which are rectangular.

It should be noted that the one of the centers (C61) of the respective junction parts J61 and J62 which is closer to the boundary lines B61 is used as one of the vertexes of the triangular region.

The slits in a second triangular region (C61-c-d) whose vertexes are ends (c, d) of a second boundary line B62 between the second linear part L62 and the aggregate junction part J60, and the center C61 of the first junction part J61 extend in the direction (Y direction) in which the second linear part L62 extends. Similarly, the slits in a third triangular region (C62-e-a) whose vertexes are ends (e, a) of a third boundary line B63 between the third linear part L63 and the aggregate junction part J60, and the center C62 of the second junction part J62 extend in the direction (Y direction) in which the third linear part L63 extends.

Moreover, the junction part J60 has a first edge E61 forming an extension of an edge (upper edge) of the first linear part L61, and the slits in a fourth triangular region (C61-d-e') whose vertexes are ends (d, e') of the edge E61 and the center C61 of the first junction part 361 extend in the direction parallel with the edge E61. It should be noted that the one of the centers (C61) of the respective junction parts J61 and J62 which is closer to the edge E61 is used as one of the vertexes of the triangular region.

Similarly, the junction part J60 also has a second edge E62 also forming an extension of an edge (upper edge) of the first linear part L61, and the slits in a fifth triangular region (C62-b-c) whose vertexes are ends (b, c) of the edge E62 and the center C62 of tire second junction part J62 extend in the direction parallel with the edge E62. Similarly, the junction part J60 also has a third edge E63 forming an extension of an edge (right edge) of the third linear part L63, and the slits in a sixth triangular region (C62-a-b) whose vertexes are ends (a, b) of the edge E63 and the center C62 of the second junction part J62 extend in the direction parallel with the edge E63.

Furthermore, the slits in a seventh triangular region (C61-C62-c) whose vertexes are the centers C61 and C62 of the first and second junction parts J61 and J62, and a corner point (c) which is an end of an edge of the second linear part L62 and which is also an end off the edge E62 of the junction part J60 extend in the direction parallel with a center-to-center line CC60 connecting the centers C61 and C62.

In addition, the slits in an eighth triangular region (C62-C61-e) whose vertexes are the centers C61 and C62 and a corner point (e) which is an end of the edge the third linear part L63 and which is also an end of the first linear part L61 extend in the direction parallel with the center-to-center line CC60.

Figure 2:
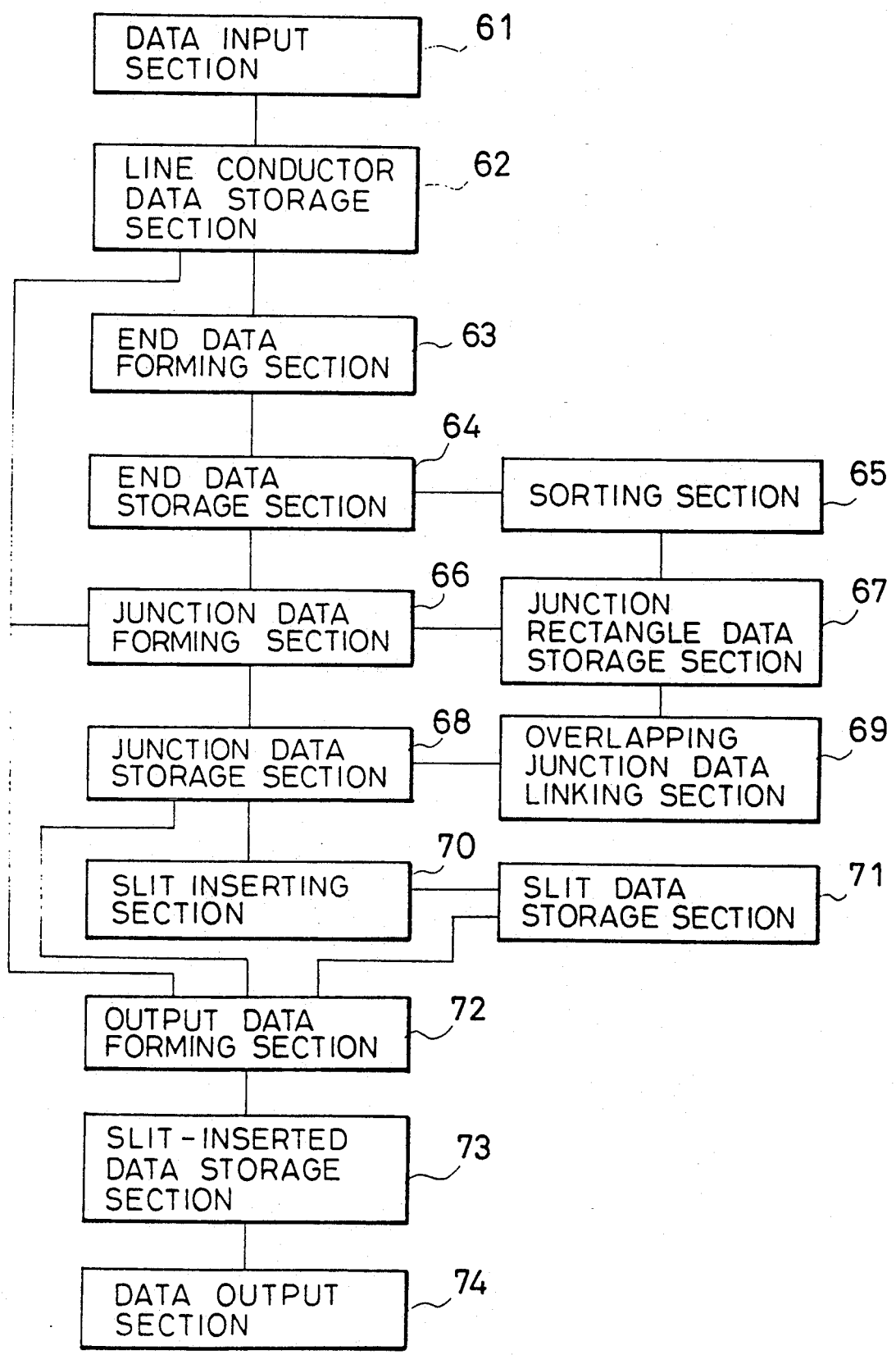
FIG. 2 is a block diagram showing the configuration of a device of another embodiment of the invention.

Apparatus used for inserting the slits will now be explained with reference to FIG. 2.

The apparatus includes a data input section 61, a line conductor data storage section 62, an end data forming section 63, an end data storage section 64, a sorting section 65, a junction (center) data forming section 66, a junction rectangle data storage section 67, a junction (center) data storage section 68, an overlapping junction (center) data linking section 69, a slit inserting section 70, a slit data storage section 71, an output data forming section 72, an slit-inserted data storage section 73, and a data output section 74, which are interconnected as illustrated. The data storage sections 62, 64, 67, 68, 71 and 73 are formed of memories. The data forming sections and other processing sections 61, 63, 65, 66, 69, 70, 72 and 74 are formed off processing circuits and associated memories.

The line conductors arc expressed by a center line, width and ends of the center line, and the conductor patterns are divided and classified Into linear parts, different-layer junctions, and identical-layer junctions.

FIG. 3, FIG. 4, FIG. 5 and FIG. 6 are diagrams showing the data used at the various data processing sections in the present apparatus. As was described, FIG. 1A to FIG. 1D show division of an identical-layer junction into triangular regions and determination of the direction of the currents at the respective triangular regions for the purpose of insertion of slits. In the following description, the conductor pattern shown in FIG. 1C will be taken as an example, and corresponding parts, points, lines or members are denoted by reference numerals or marks identical to those in FIG. 1C. The operation of the apparatus of FIG. 2 will next be described with reference to FIG. 1C and FIG. 3 to FIG. 6.

Step 1

First, line conductor data stored in an external computer, not shows, connected to the present apparatus are inputted via the data input section 61, and written in the line conductor data storage section 62.

Figure 3:
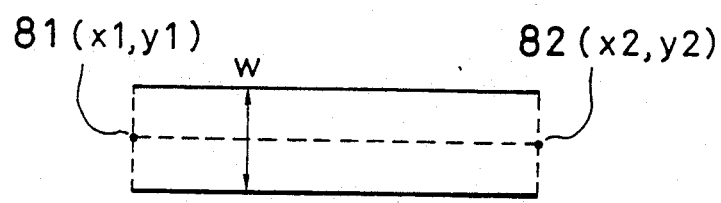
FIG. 3 is a schematic diagram showing the line conductor data.
Figure 4:
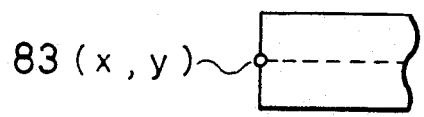
FIG. 4 is a schematic diagram showing the end data.

The "line conductor" data which are treated are expressed by its center line, its width, and the ends of the center line, which are also called ends of the line conductor. More specifically, as shown in FIG. 3, the line conductor data includes coordinate values x1, y1 of a first end 81, the layer, number LN of the first end 81, a pointer p1 (address to the memory) to a related junction data (Chat is related to the end 81.), coordinate values x2, y2 of a second end 82, a layer number L12 of the second end 82, a pointer p2 to a related junction data (Chat is related to the second end 82), the width w of the line conductor, and the layer number LN of the line conductor. The pointers p1 and p2 to the related junction data are working fields for the processing and are not filled initially, but are later filled during the processing.

Step 2

The end data forming section 63 reads the data from the line conductor storage section 62, and forms data of each end 83 (FIG. 4), i.e., the coordinate values x, y of the end, the layer LN of the end, the pointer p to the related line conductor data, and writes these data in the end data storage section 64. The end data are auxiliary data that are used for forming the junction data shown in FIG. 5. The example of FIG. 5 resembles the junction part shown in FIG. 1C. As the pointer to the line conductor data, the address in the memory in the line conductor data storage section at which the particular line conductor data are stored is entered.

Step 3

The sorting section 65 then sorts the end data using LN, x and y as keys, i.e., rearranges the end data in the ascending order of LN, and for identical LN, in the ascending order off x, and for identical LN and x, in the ascending order off y.

Step 4

Figure 5:
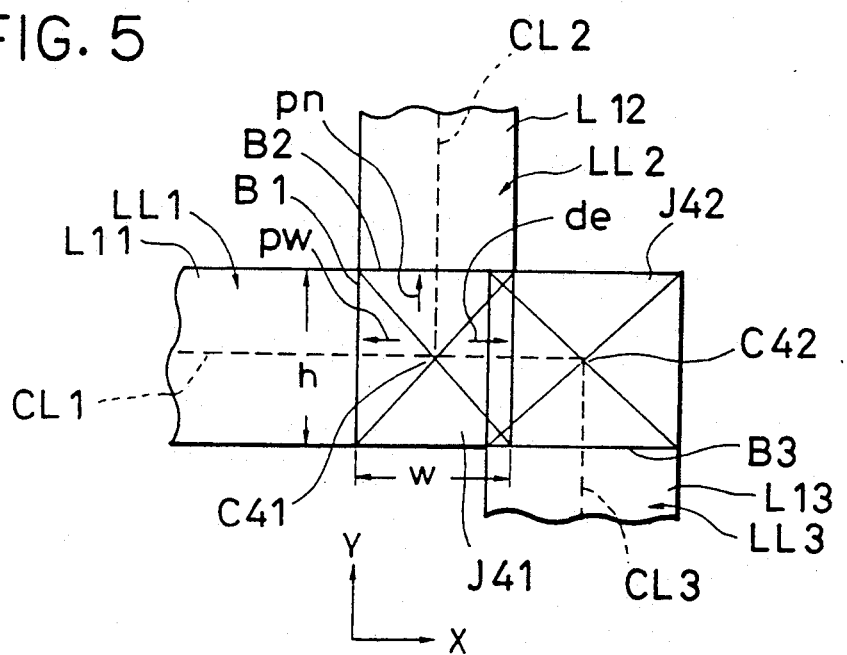
FIG. 5 is a schematic diagram showing the junction data.

The junction data forming section 66 successively reads the end data of the ends which have identical coordinate values and are therefore "connected" with each other from the end data storage section 64, forms junction data shown in FIG. 5, and writes the junction data in the junction data storage series 68. The junction data includes the coordinate values x, y of the junction center (center of the junction part, at the intersection of diagonal lines of the rectangular junction part), the width w (dimension in the x direction) of the junction part, the height h (dimension in the y direction) of the junction part, pointers pe, pn, pw and ps to the line conductor data in the positive x (right in the figure) direction, positive y (up) direction, negative x (left) direction and negative y (down) direction with respect to the junction. The fields for the junction data also include fields for pointers de, tin, dw and ds to the overlapping junction in the positive x direction, positive y direction, negative x direction and negative y direction. The pointers to the overlapping junctions are not written at this stage, but are entered later.

Figure 6:
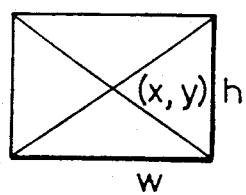
FIG. 6 is a schematic diagram showing junction rectangle data.

The junction rectangle data shown in FIG. 6 are also formed, and written in the junction rectangle data storage section 67. The junction rectangle data comprise coordinates x, y of the junction center, the width w of the junction part, the height h of the junction region, and a pointer p to the junction data. The junction rectangle data are auxiliary data which are used for linking the junction data of junctions overlapping each other. The pointer to the junction data is the address in the memory at which the junction data of the related junction are stored.

The term "overlapping" as used with respect to junction parts embraces a situation in which the one of the junction parts is wholly contained in the another junction part.

Step 5

The sorting section 65 sorts the junction rectangle data using y and x as keys, i.e., rearranges the junction rectangle data in the ascending order of y, and for identical y, in the ascending order off x.

Step 6

The overlapping junction data linking section 69 successively reads the junction rectangle data from the junction rectangle data storage section 67 to link the junction data of the junctions which overlap each other in the x direction. More specifically, if a first and second junctions overlap each other, the address of the junction data of the first junction is stored in the memory area for the overlapping junction for the second junction, while the address of the junction data of the second junction is stored in the memory area for the overlapping junction for the first junction.

Step 7

Processings identical to that of the Steps 5 and 6 are repeated for the y direction.

Step 8

The slit inserting section 70 reads the junction data from the junction data storage section 68 and performs insertion or disposition of slits for the respective parts of the line conductors. The conductors (conductor patterns) are divided into linear parts and junction parts. The linear parts are linear or straight parts, other than junction parts. The junction parts are formed where two or more linear parts are connected. It should be noted that end parts of line conductors which are inside the junction parts are not part of the linear parts. That is, while an end of the center line, e.g., CL1, CL2 or CL3, of a line conductor LL1, LL2 or LL3, may coincide with the center C41 or C42 of a junction part J41 or J42, the end of a linear part L11, L12 or L13 is the boundary B1, B2 or B3 with the junction part J41 or J42.

The slits in the linear parts L11, L12 and L13 are inserted to extend in the direction in which the respective linear part extend. The slits are intermittent, as illustrated in FIG. 1A to FIG. 1D. The slits in the junction parts J41 and J42 also :intermittent, and are shorter than the slits in the linear parts L11, L12 and L13. The rules described with reference to FIG. 1A to FIG. 1D relate to the insertion of the slits in the identical-layer junctions.

The concept adopted for determining the rules in accordance with the invention is that the electric current in the identical-layer junctions flows principally along the center lines in the junction parts (each of which is an extension of the center line of a linear part or a line connecting the centers of overlapping junction parts), or along edges of the junction parts, and if the slits are made to extend principally parallel with the direction of the electric currents, the flow path of the electric current is not unduly affected by the slits, and concentration of the electric current is avoided. On the basis of this concept, the identical-layer junction parts are divided into triangular regions and the direction one the slits in each triangular region is determined to be parallel with the center line, the edge lines, or lines connecting centers of the overlapping junction parts.

In this step, the triangular regions are classified into three types, and depending on their type, the direction of the slits and the positions of the slits are determined. Data formed as a result of the determination off the direction and position of the slits are stored in the slit data storage section 71.

Figure 7:
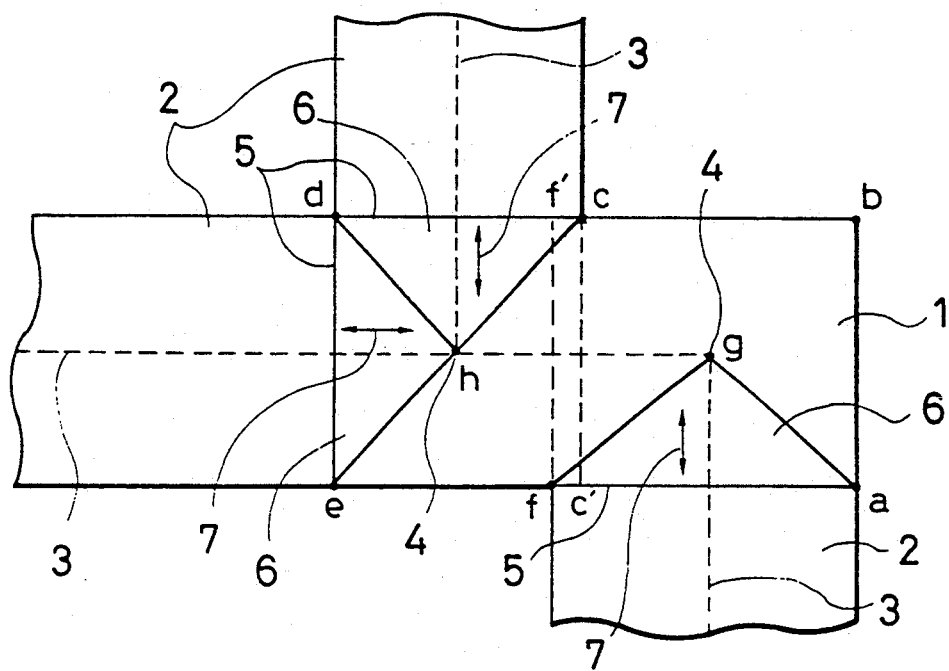
FIG. 7 to FIG. 9 are schematic diagrams showing the rules applied in extracting triangular regions.
Figure 8:
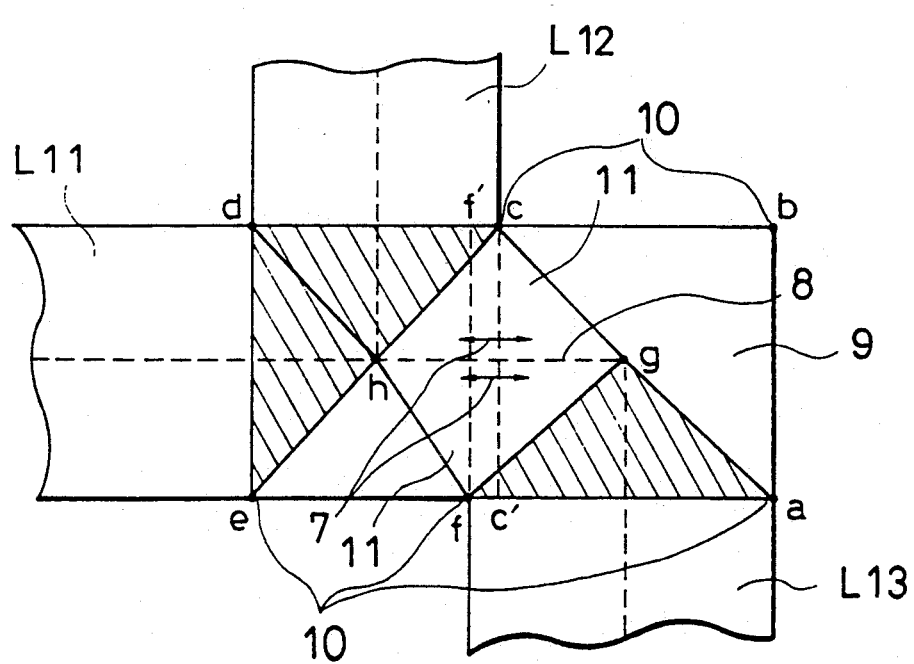
Figure 9:
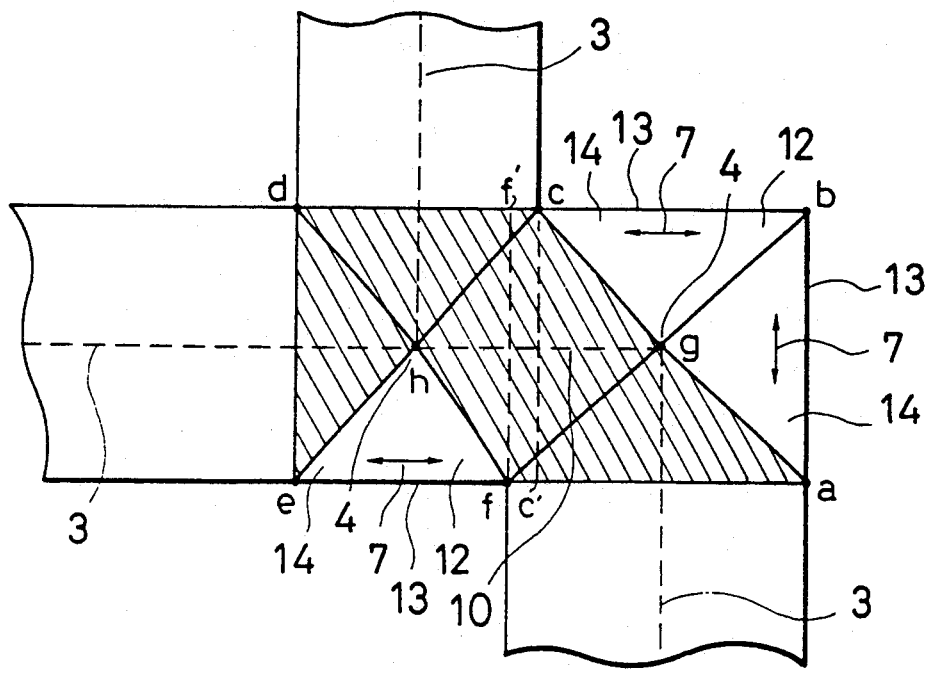

The rules applied to determine the direction off the slits are set forth below, with reference to FIG. 7 to FIG. 9 illustrating an example resembling the embodiment of FIG. 1C.

Type A

As shown in FIG. 7, triangular regions 6 (hde, hcd, gfa) of type A each of which is defined by an end 4 (h or g) of the center line 3 of the line conductor 2 which also extend outside the junction 1 (deab) and a boundary line 5 (de, cd, fa) between the linear part of the line conductor 2 and the junction 1 are extracted, and the direction 7 of the slits in these triangular regions 6 is determined to be parallel with the direction in which the linear part or its center line extends.

In other words, in a triangular region 6 whose vertexes are ends (d,e; c,d; or f,a) of a boundary line 5 between a linear part and a junction 1, and the center (h or g) of one of the junction parts (dec'c; or f'fab) which in aggregation form the junction (aggregate junction part), the slits extend in the direction in which the linear part extend (i.e., in the direction of the center line 3 of the linear part). If two or more junction parts are overlapping, as in the example of FIG. 7, one of the centers (of the respective junction parts) which is closest to the boundary line in question is used as one of the vertexes of the triangular region.

Type B

In FIG. 8, hatched regions represent the triangular regions off the type A that have been extracted in the preceding step. From the remainder 9 (unhatched region) of the junction, triangular regions 11 (hgc, ghf) each of which is defined by a center-to-center line 8 (hg) (connecting the centers h and g off the junction parts) in the unhatched, remaining region, and one of the vertexes 10 (c, e, f, a, b) of the contour off the conductor pattern of the junction which is closest to the center-to-center line 8 are extracted, and the direction 7 of the silts in these triangular regions 11 is determined to be parallel with the direction of the center-to-center line 8.

In other words, in a triangular region whose vertexes are the centers (h, g) of the two junction parts and a corner point which is an end (c) of an edge off a linear part L12 and which is also an end off an edge (cd) of one of the junction pacts (f′fab), the slits extend in the direction parallel with a center-to-center line 8 connecting the centers (h, g) of two junction parts (dec′c; f′fab) which are overlapping. In another example shown in FIG. 1D, a corner point which is an end of an edge of a linear part and also an end off an edge of another linear part (rather than an edge off a junction part) is used as one of the vertexes of the triangular regions.

Type C

In FIG. 9, hatched regions represent the triangular regions off the type A and type B that have been extracted in the preceding steps. From the remainder 12 (unhatched region) of the junction, triangular regions 14 (hef, gbc, gab) each of which is defined by an edge 13 (ef, bc, ab) in the remaining area 12 and one of the ends 4 (h, g) of the center lines 3 off the linear conductors, i.e., the centers 4 (h, g) of the junction parts (dec′c; f′fab) which is closest to the edge 13 in question are extracted, and the direction 7 of the slits in these triangular regions 14 is determined to be parallel with the edge 13 in question.

In other words, in a triangular region whose vertexes are ends (e,f; b,c; or a,b) of an edge 13 of a junction part (dec′c; or f′fab), and the center (h or g) of the junction part, the slits extend in the direction parallel with the edge. If two or more junction parts are overlapping, one of the centers (off the respective junction parts) which is closest to the edge is used as one of the vertexes of the triangular region.

Figure 10:
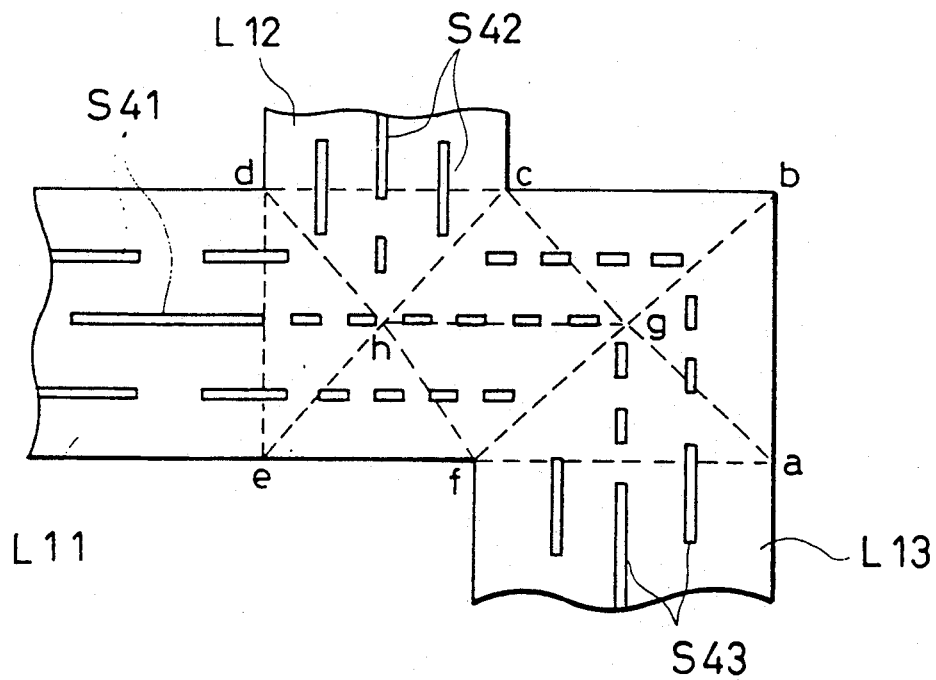
FIG. 10 is schematic diagram showing insertion of slits in an example of conductor pattern.

FIG. 10 sinews the result of the insertion of slits S0, S41, S42 and S43 in the respective triangular regions (hed, hcd, gfa) of type A, the triangular regions (hgc, ghf) of type B, and the triangular regions (hef, gbc, gab) of type C, and also in adjacent areas of the linear parts L11 to L13 in a conductor pattern, according to the above-described rules.

Step 9

The output data forming section 72 successively receives and reads junction data and slit data, and convert them into the graphic data, e.g., in the form of "GDSII" stream data ("GDSII" being a trademark of Cadence Design Automation Company), with the slits inserted, and writes the graphic data into slit-inserted data storage section 73.

Step 10

The data output section 74 outputs the graphic data to the external computer (not shown) connected to the present apparatus.

By the steps described above, conductor pattern data including line conductor data and junction data with data on the slits inserted in the linear parts and the junction parts are obtained.

Because the slits in the junction parts are shorter and oriented to be parallel with the linear parts, parallel with edges of the junction parts or parallel with the center-to-center line, depending on the triangular regions in which the respective slits are positioned, the slits extend principally parallel with the direction of the electric currents, and concentration of electric currents is therefore avoided. Moreover, because rules for determining the direction off the slits have been provided, the insertion of the slits can be carried out automatically.

I claim:

1. A semiconductive device having a semiconductor substrate and a conductor layer provided over the semiconductor substrate;

wherein said conductor layer comprises a first linear part extending in a first direction and provided with slits extending in said first direction, a second linear part extending in a second direction at an angle with said first direction and provided with slits extending in said second direction, and a junction part formed where said first and second linear parts are connected and provided with slits shorter than the slits in said first and second linear parts;

wherein said junction part is defined as a part which forms an extension of said first linear part and also forms an extension of said second linear part;

wherein said junction part has a center at the intersection of diagonal lines of said junction part, the slits in a triangular region whose vertexes are ends of a boundary line between one of said first and second linear parts and said junction part and the center of said junction part, extend in the direction in which said one of the first and second linear parts extend; and wherein said junction part has an edge forming an extension of an edge of one of said first and second linear parts, the slits in a triangular region whose vertexes are ends of said edge of said junction part and the center of said junction part extend in the direction parallel with said edge.

2. The device according to claim 1, wherein said slits in said junction part comprises a first group of slits which extend in said first direction and a second group of slits which extend in said second direction.

3. The device according to claim 1, wherein said first and second directions are at a right angle with each other.

4. A semiconductor device having a semiconductor substrate and a conductor layer provided over the semiconductor substrate;

wherein said conductor layer comprises a first linear part extending in a first direction and provided with slits extending in said first direction, a second linear part extending in a second direction at an angle with said first direction and provided with slits extending in said second direction, a third linear part extending in said second direction and provided with slits extending in said second direction, a first junction part formed where said first and second linear parts are connected, and a second junction part formed where said first and third linear parts are connected, said first and second junction parts overlapping each other to form an aggregate, third junction part, said third junction part being provided with slits shorter than the slits in said first and second linear parts;

wherein said first junction part is defined as a part which forms an extension of said first linear part and also forms an extension of said second linear part, and said second junction part is defined as a part which forms an extension of said first linear part and also forms an extension of said third linear part;

wherein said first junction part has a first center at the intersection of diagonal lines of said first junction part, said second junction part has a second center at the intersection of diagonal lines of said second junction part, the slits in a triangular region whose vertexes are ends of a boundary line between one of said first, second and third linear parts and said third junction part, and that one of the first and second centers which is closer to said boundary line extend in the direction in which said one of the first, second and third linear parts extends; and wherein one of said first and second junction parts has an edge forming an extension of an edge of one of said first, second and third linear parts, and the slits in a triangular region whose vertexes are ends of said edge and the center of said one of the first and second junction parts extend in the direction parallel with said edge.

5. The device according to claim 4, wherein said slits in said third junction part comprises a first group of slits which extend in said first direction and a second group of slits which extend in said second direction.

6. The device according to claim 4, wherein said first and second directions are at a right angle with each other.

7. The device according to claim 4, wherein there are slits in a triangular region whose vertexes are:
one of the first and second centers of said first and second junction parts,
corner points which are ends of the edges of said first and second linear parts, and
end points of edges of said third junction part,
said slits in said triangular region extending in the direction parallel with a center-to-center line connecting said first and second centers.

8. A conductor structure on a semiconductor substrate comprising:
a first conductor part extending in a first direction;
a second conductor part extending in a second direction at an angle with respect to said first direction;
first slits provided in said first conductor part and extending in said first direction;
second slits provided in said second conductor part and extending in said second direction;
a third conductor part in the shape of a quadrilateral and forming a connecting part where said first conductor part and said second conductor meet, a junction point being defined at an intersection of diagonal lines of the quadrilateral which diagonal lines extend between opposite corners of the quadrilateral, the junction point thereby being at a center of said third conductor part;

wherein:
the third conductor part has four triangular regions, each being defined by a vertex which is at the junction point, and by a respective base which corresponds to one side of the quadrilateral;
third slits are provided in at least one triangular region which region terminates at the respective base thereof, said third slits extending parallel with the respective base;
fourth slits are provided in a triangular region which adjoins at a respective base thereof with said first conductor part, said fourth slits extending in said first direction;
fifth slits are provided in a triangular region which adjoins at a respective base thereof with said second conductor part, said fifth slits extending in said second direction; and
all of said third, fourth and fifth slits provided in said third conductor part are shorter than said first and second slits.

* * * * *